United States Patent
Sato et al.

(10) Patent No.: US 8,410,561 B2
(45) Date of Patent: *Apr. 2, 2013

(54) ELECTRONIC DEVICE AND METHOD FOR MANUFACTURING THEREOF

(75) Inventors: Akira Sato, Fujimi-machi (JP); Toru Watanabe, Matsumoto (JP); Shogo Inaba, Shiojiri (JP); Takeshi Mori, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 18 days.

This patent is subject to a terminal disclaimer.

(21) Appl. No.: 12/975,065

(22) Filed: Dec. 21, 2010

(65) Prior Publication Data

US 2011/0089521 A1  Apr. 21, 2011

Related U.S. Application Data

(63) Continuation of application No. 12/707,943, filed on Feb. 18, 2010, now Pat. No. 7,880,245, which is a continuation of application No. 11/875,383, filed on Oct. 19, 2007, now Pat. No. 7,709,912.

(30) Foreign Application Priority Data

Nov. 8, 2006  (JP) .................................. 2006-302478

(51) Int. Cl.
*H01L 31/00* (2006.01)

(52) U.S. Cl. ........ 257/414; 257/484; 257/680; 257/704; 257/E31.001

(58) Field of Classification Search ............. 257/414, 257/484, 680, 704, E31.001
See application file for complete search history.

(56) References Cited

U.S. PATENT DOCUMENTS

| 7,402,907 B2 | 7/2008 | Ohguro |
| 7,709,912 B2 * | 5/2010 | Sato et al. ........ 257/414 |
| 7,880,245 B2 * | 2/2011 | Sato et al. ........ 257/414 |
| 2006/0232638 A1 | 10/2006 | Kuroda et al. |
| 2007/0018761 A1 | 1/2007 | Yamanaka et al. |
| 2009/0160912 A1 * | 6/2009 | Silverbrook et al. ........ 347/63 |
| 2009/0272196 A1 * | 11/2009 | Silverbrook et al. ........ 73/729.2 |

FOREIGN PATENT DOCUMENTS

| JP | A-2000-124470 | 4/2000 |
| JP | A-2005-72420 | 3/2005 |
| JP | A-2005-123561 | 5/2005 |
| JP | A-2005-262686 | 9/2005 |
| JP | A-2005-297180 | 10/2005 |
| JP | A-2005-322666 | 11/2005 |
| JP | A-2006-007459 | 1/2006 |
| JP | A-2006-21332 | 1/2006 |
| JP | A-2006-88268 | 4/2006 |
| JP | A-2006-147995 | 6/2006 |
| JP | A-2006-224220 | 8/2006 |
| JP | A-2006-263902 | 10/2006 |
| JP | A-2007-000994 | 1/2007 |
| JP | A-2007-35290 | 2/2007 |
| JP | A-2007-36201 | 2/2007 |
| WO | WO 2005/061376 A1 | 7/2005 |

OTHER PUBLICATIONS

Oct. 30, 2009 Office Action issued in Chinese Patent Application No. 2007101692476 (with English language translation).

* cited by examiner

Primary Examiner — Victor A Mandala
(74) Attorney, Agent, or Firm — Oliff & Berridge, PLC

(57) ABSTRACT

An electronic device, including a substrate, a functional structure constituting a functional element formed on the substrate, and a cover structure forming a cavity portion in which the functional structure is disposed, is disclosed. In the electronic device, the cover structure includes a laminated structure of an interlayer insulating film and a wiring layer, the laminated structure being formed on the substrate in such a way that it surrounds the cavity portion, and the cover structure has an upside cover portion covering the cavity portion from above, the upside cover portion being formed with part of the wiring layer that is disposed above the functional structure.

17 Claims, 4 Drawing Sheets

ELECTRONIC DEVICE AND METHOD FOR MANUFACTURING THEREOF

CROSS-REFERENCE TO RELATED APPLICATION

This is a Continuation of application Ser. No. 12/707,943 filed Feb. 18, 2010 (issued as U.S. Pat. No. 7,880,245 on Feb. 1, 2011), which is a Continuation of application Ser. No. 11/875,383 filed Oct. 19, 2007 (issued as U.S. Pat. No. 7,709,912 on May 4, 2010), which claims the benefit of Japanese Patent Application No. 2006-302478 filed Nov. 8, 2006. The disclosures of the prior applications are hereby incorporated by reference herein in their entirety.

BACKGROUND

1. Technical Field

Embodiments of the present invention relate to an electronic device and a method for manufacturing thereof, and more particularly to a structure and a manufacturing process of an electronic device having a functional element such as a micro electromechanical system (MEMS) disposed in a cavity portion formed on a substrate.

2. Related Art

Electronic devices that include a functional element such as a MEMS disposed in a cavity portion formed on a substrate, are generally known. For example, a MEMS such as a micro resonator, a micro sensor or a micro actuator is housed in a cavity portion in an operable state because the micro structure needs to be disposed in a state that permits vibration, deformation and such other operations.

JP-A-2005-297180 and JP-A-2005-123561 are examples of related art.

As a way to form the cavity described above, a method disclosed in JP-A-2005-297180 is known, in which a micro mechanical element is formed on a surface of one substrate, the one substrate being then joined in a vacuum chamber with another substrate, with an O ring therebetween, and subsequently a sealant material is filled outside the O ring.

A method disclosed in JP-A-2005-123561 is also known as another way to form the cavity. In the method, a MEMS structure is formed on a substrate, and then a sacrificial layer is formed thereon. A first sealant member having through holes is further formed on the sacrificial layer, and the sacrificial layer is subsequently removed through the through holes of the first sealant member to release the movable part of the MEMS structure. Finally, the through holes of the first sealant member are closed by being covered with a second sealant member such as a chemical vapor deposition (CVD) film.

However, one of the problems of the first method described above, in which two substrates are joined, is that it increases the material cost because it requires another substrate to be used exclusively for the sealing. In addition, even though the use of an ordinary semiconductor manufacturing technique is desired, the special process of joining the two substrates, which the method requires, diminishes the merit of using the semiconductor manufacturing technique, increasing the manufacturing cost.

Furthermore, the second related art document described above, which proposes the above second method that uses the first sealant member having through holes and the second sealant member closing the through holes, essentially discloses only description of cases in which the MEMS structure is manufactured separately. It gives no suggestion of the structure and the manufacturing process of the device in cases where a MEMS structure is fabricated integrally with an electronic circuit. Normally, it is difficult to enhance the structural integrity between a MEMS structure and an electronic circuit or to manufacture a MEMS structure in common processes with an electronic circuit, and it is necessary to manufacture a MEMS structure independently from the manufacturing process of an electronic circuit. Thus, the method not only keeps the manufacturing cost from being reduced, but also may adversely affect the performance of the MEMS structure as well as of the electronic element through technical impact that may be caused by the both processes.

SUMMARY

Embodiments of the invention solve the problems described above by highly integrating the functional structure, being disposed in the cavity on the substrate, with an electronic circuit, thereby realizing a more miniaturized electronic device. Embodiments of the invention also allow the functional structure disposed in the cavity on the substrate to be manufactured in parallel with the electronic circuit, thereby reducing the cost of manufacture.

An electronic device according to a first aspect includes: a substrate; a functional structure formed on the substrate, the structure constituting a functional element; and a cover structure forming a cavity in which the functional structure is disposed. The cover structure includes a laminated structure of an interlayer insulating film and a wiring layer, the laminated structure being formed on the substrate in such a manner that it surrounds the cavity. The upside cover portion of the cover structure, covering the cavity from above, is formed with part of the wiring layer that is disposed above the functional structure.

Because the cover structure forming the cavity portion housing the functional structure includes the laminated structure of the interlayer insulating film and the wiring layer, and because the upper cover portion covering the cavity portion from above is formed with part of the wiring layer, the cover structure forming the cavity portion housing the functional structure can be structurally highly integrated with the electronic circuit while also the manufacturing process for the functional structure and that for the electronic circuit can be easily made into a common process. As a result, the electronic device can be reduced in size while also the manufacturing cost thereof can be reduced. Moreover, the upside cover portion, being made of a conductive material that is part of the wiring layer, lowers the electromagnetic interaction between the functional structure and the outside.

Preferably, the upside cover portion includes a first cover layer having through holes leading to the cavity portion and a second cover layer closing the through holes of the first cover layer, the first cover layer being formed of part of the wiring layer. This permits the movable part of the functional structure to be released when the surrounding areas of the functional structure are removed by way of the through holes of the first cover layer. The cavity portion can be sealed by subsequent formation of the second cover layer that closes the through holes.

An electronic device according to a second aspect includes: a substrate; a functional structure constituting a functional element formed on the substrate; and a cover structure forming a cavity portion in which the functional structure is disposed. The cover structure includes a laminated structure of an interlayer insulating film and a wiring structure, the laminated structure being formed on the substrate in such a shape that it surrounds the cavity portion. An enclosure is provided at the surrounding part of the cover portion, covering the cavity portion from around, the enclosure being formed with part of the wiring layer having a planar shape that surrounds the cavity portion.

Because the cover structure that forms the cavity portion that houses the functional structure includes the laminated structure of the interlayer insulating film and the wiring layer, and, moreover, because the enclosure formed with part of the wiring layer is provided at the surrounding part of the cover portion, covering the cavity portion from around, the cover structure forming the cavity portion housing the functional structure can be structurally highly integrated with the electronic circuit while the manufacturing process of the functional structure and that of the electronic circuit can be easily made into a common process, thereby permitting the electronic device to be reduced in size and the manufacturing cost to be also lowered. Furthermore, because the enclosure having a planar shape that surrounds the cavity portion is made of a conductive material that constitutes part of the wiring layer, the electromagnetic interaction between the functional structure and the outside can be reduced and the region to be etched in the release process for the functional structure can be limited by the enclosure, thereby allowing the cavity portion to be easily made smaller.

Preferably, the surrounding cover includes a base enclosure that is formed with the same layer and material as the functional structure and has a shape that surrounds the cavity portion, the base enclosure being overlain by the above-described enclosure. With the base enclosure and the enclosure being vertically disposed in the surrounding cover portion, the above electromagnetic interaction can be made lower and reduction in the size of the cavity portion can be achieved more easily.

Preferably, the enclosure is coupled to the base enclosure over the whole of its circumference. This vertically integrates the base enclosure and the enclosure, thereby allowing the above-described electromagnetic interaction to be further lowered and the above-described reduction in the size of the cavity portion to be realized even more easily.

A method for manufacturing an electronic device according to a third aspect, with the electronic device having a substrate, a functional structure formed on the substrate and constituting a functional element, and a cover structure forming a cavity in which the functional structure is disposed, includes: a structure forming process for forming the functional structure together with a sacrificial layer; an interlayer insulating film forming process for forming an interlayer insulating film on the functional structure; a wiring forming process for forming a wiring layer on the interlayer insulating film, part of the wiring layer being made to form a first cover layer that covers the upside of the functional structure and having through holes; a release process for removing the interlayer insulating film on the functional structure (the part of the interlayer insulating film existing over the functional structure) and the sacrificial layer by way of the through holes of the first cover layer; and a covering process for forming a second cover layer that closes the through holes of the first cover layer.

An method for manufacturing an electronic device according to a fourth aspect, with the electronic device including a substrate, a functional structure constituting a functional element formed on the substrate, and a cover structure forming a cavity portion in which the functional structure is disposed, includes: a structure forming process for forming the functional structure together with a sacrificial layer; an insulating film forming process for forming an interlayer insulating film on the functional structure; a wiring forming process for forming a wiring layer on the interlayer insulating film, part of the wiring layer being made to form an enclosure having a planar shape that surrounds the functional structure; a first covering process for forming a first cover layer above the functional structure, the first cover layer having through holes; a release process for removing the interlayer insulating film on the functional structure (the part of the interlayer insulating film existing over the functional structure) and the sacrificial layer by way of the through holes of the first cover layer; and a second covering process for forming a second cover layer that closes the through holes of the first cover layer.

Preferably, in the structure forming process, a base enclosure that supports the enclosure is formed together with the functional structure, the base enclosure having a shape that surrounds the functional structure.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Embodiments of the invention will be described.

First Embodiment

Referring to FIGS. 1 through 8, a method for manufacturing an electronic device according to one embodiment will be described.

Figure 1:
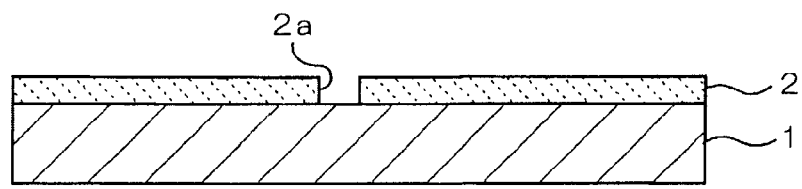
FIG. 1 is a sectional view schematically showing a manufacturing process according to one embodiment.

First, as shown in FIG. 1, a substrate 1 comprised of, e.g., a semiconductor substrate is placed. It is preferable that the substrate 1 is a semiconductor substrate, such as a silicon substrate, but various other substrates including a ceramics substrate, a glass substrate, a sapphire substrate, a diamond substrate, a synthetic resin substrate, and the like, can be used. When a semiconductor substrate is used, a predetermined semiconductor integrated circuit (not illustrated; a metal oxide semiconductor (MOS) transistor, for example) may be fabricated on the substrate 1 either in advance or at some adequate point of the process. The substrate 1 that is used in the manufacturing method according to the present embodiment includes a proper impurity region (not illustrated) on its surface part. Furthermore, the manufacturing method is programmed in such a way that a proper wiring structure is formed on the semiconductor substrate to form the electronic device (semiconductor integrated circuit) as an entirety through a complementary metal-oxide semiconductor (CMOS) process.

In the embodiment, a sacrificial layer 2 is formed on the surface of the substrate 1. The sacrificial layer 2 may be made, for example, with an oxide silicon film or a phosphorus doped glass (PSG) film by means of the chemical vapor deposition (CVD), the sputtering or such other techniques. In the illustrated example, an aperture 2a that is provided for formation of the supporting part of a MEMS structure, which will be described later, is formed by an appropriate patterning process, such as etching, using a patterning mask that has been formed by photolithography.

Figure 2:
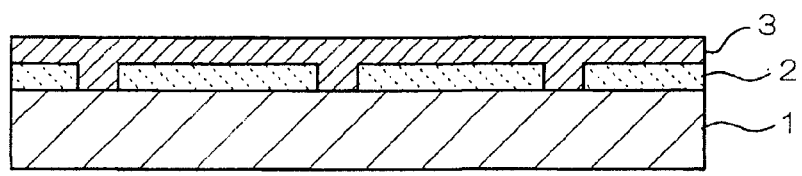
FIG. 2 is a sectional view schematically showing a manufacturing process according to one embodiment.
Figure 3:
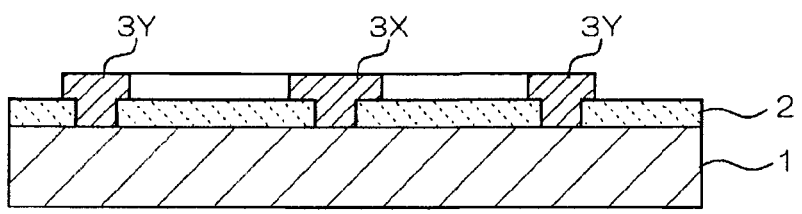
FIG. 3 is a sectional view schematically showing a manufacturing process according to one embodiment.

Then, as shown in FIG. 2, a functional layer 3 made of a conductive silicon film (a doped polycrystalline silicon), or the like, is formed on the above sacrificial layer 2. The functional layer 3 is coupled to the substrate 1 (e.g. a bottom electrode, not illustrated, formed on the substrate 1) via the aperture 2a that has been formed in such a manner as described above. The functional layer 3 is formed by the sputtering, the CVD or such other technique. Then, through patterning of the functional layer 3 using an appropriate patterning technique, a MEMS structure 3X is formed as a functional structure, as shown in FIG. 3. Here, the MEMS structure 3X has been described as having a single layer, but it may actually be formed into a laminated structure having two or more layers.

In the illustrated example, the MEMS structure 3X is provided in the shape of a diaphragm having a supporting part at its bottom center, the supporting part corresponding to the aperture 2a of the sacrificial layer 2, but illustration of a counter electrode, and the like, is omitted here. Furthermore, the example only schematically illustrates the MEMS structure and is not an exact representation of its actual construction. The MEMS structure may be made in the form of a movable part having a planar pattern that is shaped like comb teeth, a beam, a disc, or other different forms. Alternatively, it may be made as an element with any chosen function, such as one used as a resonator, one used as an actuator, or one used as a sensor.

Instead of the MEMS structure 3X, the structure may also be a functional structure for constituting a functional element like a quartz crystal resonator, a surface acoustic wave (SAW), an acceleration sensor, a gyroscope, or various other elements that are not MEMS. That is to say, the functional element according to the embodiment may be any if only it is a functional structure that can be disposed in the cavity. Here, it is also acceptable if the functional structure constitutes only part of the functional element.

In the present embodiment, a base enclosure (guard ring) 3Y that is made in such a way as to horizontally surround the MEMS structure 3X, is formed simultaneously with the above MEMS structure 3X. The base enclosure 3Y is made of the same layer and material as the MEMS structure 3X, and formed simultaneously with the MEMS structure 3X through patterning of the functional layer 3. The planar shape of the base enclosure 3Y is quadrangular (square) in the illustrated example, but it may also have a circular, polygonal or any other shape if only it is closed and surrounds the MEMS structure 3X. Preferably, the base enclosure 3Y is made of a material that is not removed substantially in the release process for removing the sacrificial layer 2 mentioned above and an interlayer insulating film described later (in other words, the removal technique chosen for the release process allows selection between materials that should be removed and the base enclosure 3Y that should be left intact). More preferably, the base enclosure 3Y is made of a conductive material. Among such conductive materials, for example, are a conductive semiconductor (a doped and highly concentrated semiconductor), a polysilicon, or a metal material.

Figure 4:
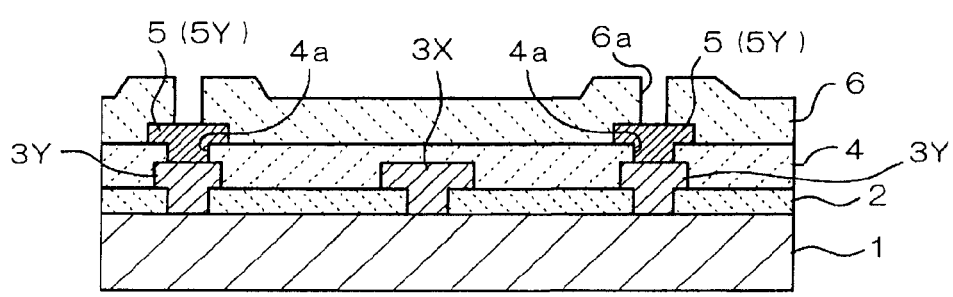
FIG. 4 is a sectional view schematically showing a manufacturing process according to one embodiment.

Next, as illustrated in FIG. 4, an interlayer insulating film 4 made of an insulating material such as oxide silicon (e.g. a CVD film whose raw gas is tetraethyl orthosilicate (TEOS)), a wiring layer 5 made of a conductive material such as aluminum, and an interlayer insulating film 6 made of an insulating material such as oxide silicon, are formed in series. This laminated structure is formed in the same manner as in an ordinary CMOS process. The laminated structure ultimately constitutes a cover structure for forming the cavity that houses the MEMS structure 3X. The wiring layer 5 is partly exposed by through holes 6a that are designed for conductive coupling to an upper structure. The number of laminated layers for the laminated structure, including the interlayer insulating film 4, the wiring layer 5, the interlayer insulating film 6, and the like, is adequately arranged as the occasion demands. For example, in an actual CMOS process, there are cases where more wiring layers are laminated with interlayer insulating films in-between, respectively.

In the case of the present embodiment, the enclosure (guard ring) 5Y having a planar shape that surrounds the MEMS structure 3X is constructed through formation of an aperture 4a for exposing the above base enclosure 3Y in the interlayer insulating film 4 and formation of part of the wiring layer 5 in the aperture 4a. Although the wiring layer 5 is not illustrated in FIG. 4 except for the enclosure 5Y, the wiring layer 5 is actually formed in such a manner that a predetermined wiring pattern is made, part of which becomes the enclosure 5Y shown in the illustration. However, it is preferable that the enclosure 5Y is not conductively coupled to other wiring patterns. Here, the enclosure 5Y is arranged so as to have a circular, polygonal or such other closed planar shape surrounding the MEMS structure 3X, in the same way as in the case of the base enclosure 3Y described above. In this case, the above aperture 4a and the part of the enclosure 5Y coupling via the inside of the aperture 4a are rendered a closed shape surrounding the MEMS structure 3X, thereby allowing the base enclosure 3Y and the enclosure 5Y to be constructed as an integrated side wall.

The wiring layer 5 is single layer in the illustrated example, but a plurality of wiring layers 5 may be laminated with interlayer insulating films respectively in-between. In this case, the enclosure 5Y is also multilayer. Here, it is preferable that a plurality of enclosures 5Y are coupled through the apertures of the interlayer insulating films. Especially, the plurality of enclosures 5Y are formed as an integrated side wall if the apertures themselves and the parts of the enclosures coupling via the inside of the apertures are arranged to have a closed shape surrounding the MEMS structure 3X.

Figure 5:
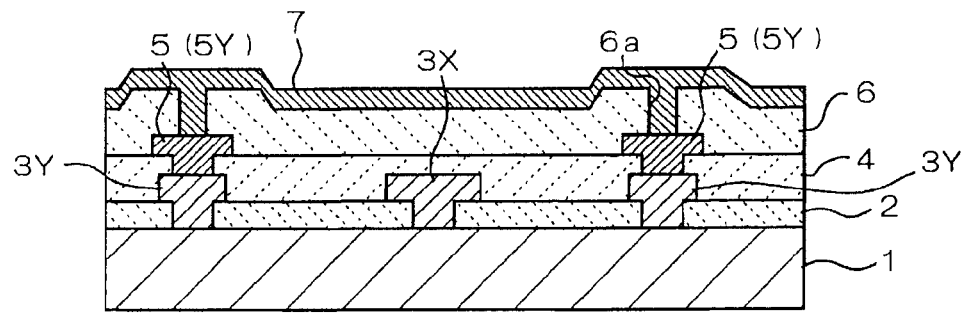
FIG. 5 is a sectional view schematically showing a manufacturing process according to one embodiment.
Figure 6:
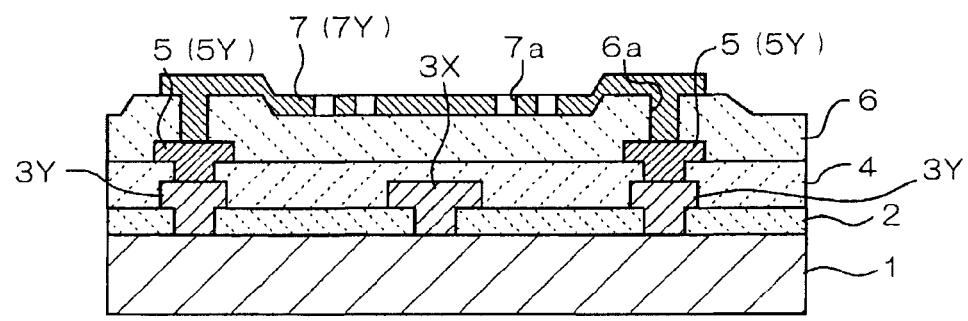
FIG. 6 is a sectional view schematically showing a manufacturing process according to one embodiment.

Subsequently, as shown in FIG. 5, a conductor layer 7 made of aluminum, or the like, is formed on the interlayer insulating film 6, the conductor layer 7 being then patterned to form a wiring layer 7, not illustrated, and a first cover layer 7Y is formed as part of the wiring layer 7, as illustrated in FIG. 6. Here, the first cover layer 7Y is disposed in such a manner as to cover the upside of the MEMS structure 3X. Also, in the case of the present embodiment, a plurality of through holes 7a are formed in the first cover layer 7Y. In the illustrated example, the through holes 7a are arranged through the length and breadth of the first cover layer 7Y to provide part of it with a network structure. The through holes 7a are formed simultaneously with patterning of the conductor layer 7. Therefore, the manufacturing process is in no way different from the case where the first cover layer 7Y is not formed (that is, from the case where only the wiring pattern of the wiring layer 7, not illustrated, is formed).

Here, the first cover layer 7Y is coupled with the above enclosure 5Y through the above aperture 6a. It is preferable, in particular, that the above aperture 6a has a closed shape surrounding the MEMS structure 3X and that also the coupling part of the first cover 7Y, running through the aperture 6a, with respect to the enclosure 5Y, has a closed shape surrounding the MEMS structure 3X.

Thus, when an integrated side wall 10Y is formed by the base enclosure 3Y, the enclosure 5Y and the first cover layer 7Y, the MEMS structure 3X is completely enveloped by the substrate 1, the side wall 10Y and the first cover layer 7Y, from underneath, from above and from the side.

It is preferable that the base enclosure 3Y, the enclosure 5Y and the first cover layer 7Y, or the above side wall 10Y made by integration of these three, are given a predetermined potential (e.g. the ground potential) either individually or integrally. This allows the MEMS structure 3X to be electromagnetically shielded to some extent from the outside, thereby allowing the electromagnetic interaction between the MEMS structure 3X and the outside to be reduced in accordance with the increase in the shield factor for the MEMS structure 3X.

Figure 7:
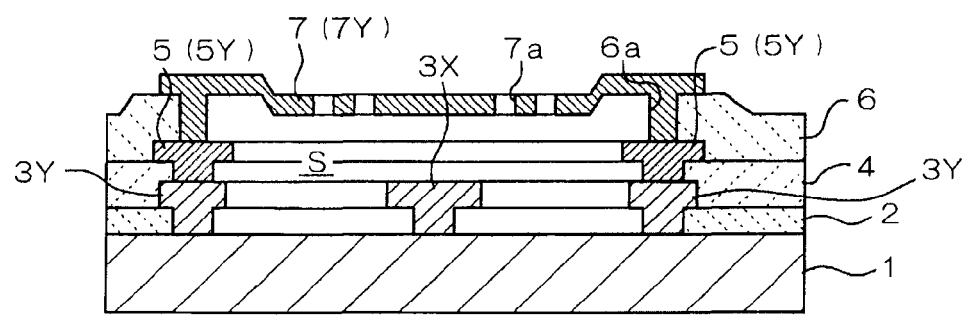
FIG. 7 is a sectional view schematically showing a manufacturing process according to one embodiment.

Next, as shown by the illustration in FIG. 7, the parts of the interlayer insulating film 6, the interlayer insulating film 4 and the sacrificial layer 2, existing around the MEMS structure 3X, are removed, thereby forming a cavity portion S for housing the MEMS structure 3X (release process). Here, the removal of the interlayer insulating film 6, the interlayer insulating film 4 and the sacrificial layer 2 via the through holes 7a may be performed by wet etching using hydrogen fluoride (HF), buffered hydrogen fluoride (BHF), or the like, or by dry etching using a hydrofluoric gas (steam), or the like. Since these are isotropic etching techniques, the MEMS structure 3X can be easily released even via the small through holes 7a.

The above etching techniques do not substantially exercise capability for removal of the MEMS structure 3X, the base enclosure 3Y, the enclosure 5Y and the first cover layer 7Y. Therefore, the portions of the interlayer insulating film 6, the interlayer insulating film 4 and the sacrificial layer 2 existing around the MEMS structure 3X can be fully removed without having the cavity portion S expanded toward the outside of the base enclosure 3Y and the enclosure 5Y. Here, the cavity portion S is sufficiently washed when the release process has been completed. For example, the cavity portion S is rinsed, and then the remaining moisture is completely removed. The base enclosure 3Y, the enclosure 5Y and the first cover layer 7Y constitute the surrounding cover for the above.

Figure 8:
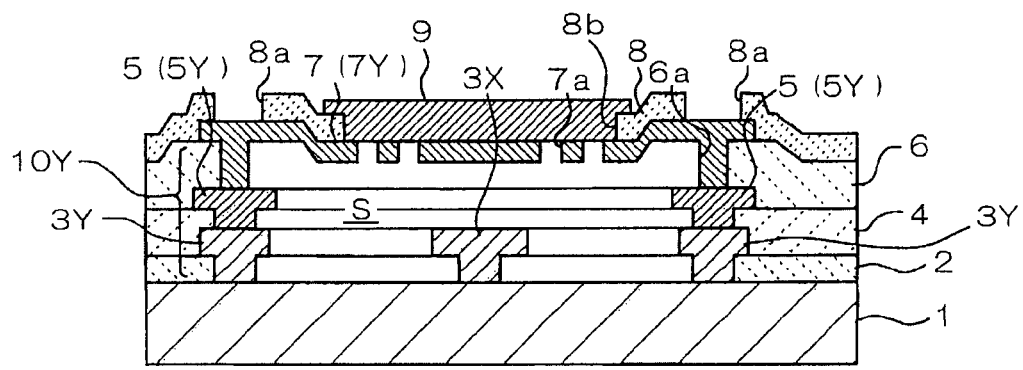
FIG. 8 is a longitudinal sectional view schematically showing a state of completion according to one embodiment.

Next, as illustrated in FIG. 8, a protection film made of oxide silicon, silicon nitride, resin materials, or the like, is formed on the interlayer insulating film 6, the first cover layer 7Y and other portions (not illustrated) of the wiring layer 7 that has been formed simultaneously with the first cover layer 7Y. A surface protection film (passivation film) made of silicon nitride, insulation resist, or the like, may be used for the protection film 8. Then, an aperture 8a is formed in the protection film 8 by dry etching or such other technique, thereby exposing the first cover layer 7Y and part of the above wiring layer to use as pads for conductive coupling. An aperture 8b is formed in the insulation film 8 simultaneously with the above aperture 8a, the aperture 8b exposing the part of the first cover layer 7Y existing above the MEMS structure 3X (the region where the through holes 7a are formed). The formation and patterning of the protection film 8 may be performed before the above release process if the protection film 8 is made of a material that resists the etching in the release process, or if a mask made of a material like resist is formed on the surface of the protection film.

Lastly, the through holes 7a are closed by a second cover layer 9 that is formed on the first cover layer 7Y to seal the above cavity portion S. It is preferable that the second cover layer 9 is formed by a vapor growth method like the CVD or the sputtering technique. This allows the cavity portion S to be sealed as it is under the state of a reduced pressure. For the second cover layer 9 formed by a vapor growth method, for example, an insulating material such as oxide silicon or silicon nitride (the CVD technique) or a metal or other conductive material such as Al, W, Ti (the sputtering technique) is suitable.

In this process, if the second cover layer 9 is formed with a metal or such other conductive material, the part thereof deposited on the aperture 8a may be left to form a coupling pad. The upside cover portion mentioned above includes the first cover layer 7Y and the second cover layer 9.

Second Embodiment

Figure 9:
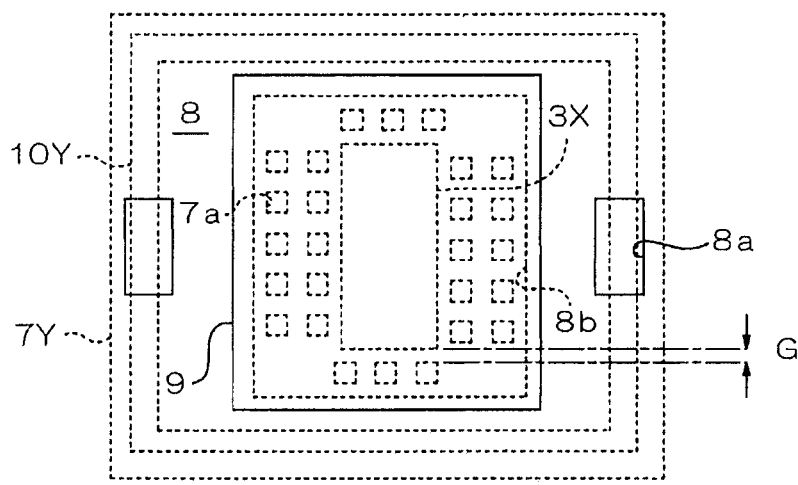
FIG. 9 is a partial plan view showing a planar shape according to one embodiment.

Referring to FIG. 9, an electronic device according to another embodiment of the will be described. As shown in this illustration, it is preferable that the through holes 7a provided in the first cover layer 7Y are formed in such a manner that they are large enough to allow etching in the release process and small enough to be easily closed by the second cover layer 9. For example, it is preferable that their size is about 1 to 10 µm, more specifically 3 to 5 µm, when reduced to the diameter of an equivalent circle. Also preferable is that the through holes 7a are circular or regularly polygonal in shape (square in the illustrated example) due to the same reasons as above.

Preferably, the through holes 7a are formed at locations that are somewhat offset from the location right above the MEMS structure 3X. In the illustrated example, the through holes 7a are arranged in such a manner that they exist at locations that are horizontally away from the MEMS structure 3X by as much as a distance G. Such an arrangement avoids troubles including adhesion of the material of the second cover layer 9, or the like, onto the MEMS structure 3X when, for example, the second cover layer 9 is formed. The distance G depends on the method by which the second cover layer 9 is formed, but if the layer is formed by the vapor growth method described above, it is preferable that the distance G is at least 0.5 µm, and practically about 0.5 to 5.0 µm.

Figure 10:
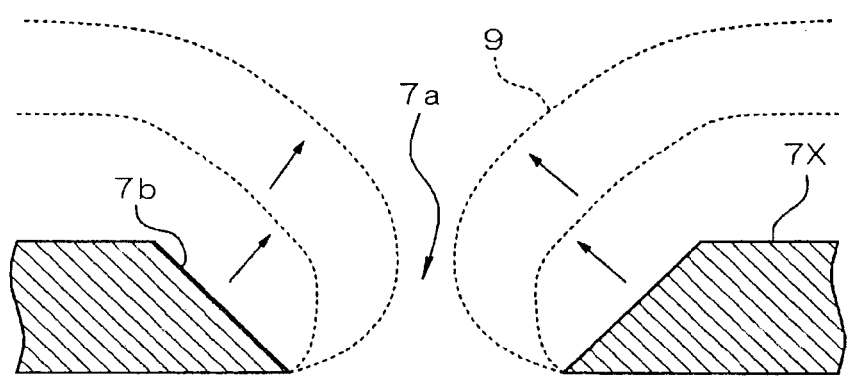
FIG. 10 is an enlarged partial sectional view showing a state of a second cover layer deposited on a through hole of a first cover layer according to one embodiment.

FIG. 10 represents an enlarged partial section illustrating an enlarged view of the portion where one of the through holes 7a of the first cover layer 7Y is formed. The shape of the through hole 7a may be any, but the inside face 7b of the through hole 7a is formed as a face that is inclined toward outside (upwards in the illustration), thereby allowing the through hole 7a to be easily closed when the second cover layer 9 is deposited. Whereas the inclined inside face 7b is formed over the entire thickness of the first cover layer 7Y in the illustrated example, it may be formed over part of the thickness.

The electronic device of the embodiment has a cover structure in which the cavity portion S containing the MEMS structure 3X is surrounded by the laminated structure including the interlayer insulating films 4 and 6 and the wiring layers 5 and 7. The cover structure forms the above cavity portion S while the first cover layer 7Y, covering the upside of the cavity S, is formed with part of the above wiring layers, thereby enhancing the integrity with the electronic circuit that requires the above laminated structure. Thus, the electronic device can be reduced in size and the cost of manufacture thereof can be controlled. Especially, since the first cover layer 7Y covering the MEMS structure 3X is made of a conductive material constituting part of the wiring layers, the electromagnetic interaction with the outside can be reduced. In this case, it goes without saying that it will be even more preferable if the second cover layer 9 is also made of a conductive material.

Also, in the above cover structure, the enclosure 5Y having a closed planar shape surrounding the MEMS structure 3X is formed with part of the wiring layer. This enhances the integrity with the electronic circuit that requires the above laminated structure, thereby allowing the size of the electronic device to be reduced and the manufacturing cost thereof to be curbed. In particular, the existence of the enclosure 5Y allows the region of side etching to be contained at the time of the release process, thereby making it easy to reduce the size of the cavity portion S containing the MEMS structure 3X and further reducing the electromagnetic interaction between the MEMS structure 3X and the outside because of the existence of the enclosure 5Y that is made of the conductive material constituting part of the wiring layers.

In the above structure, an integrated side wall 10Y further formed to surround the MEMS structure 3X allows the region removed in the release process to be horizontally confined in full, thereby allowing the cavity portion S to be made further smaller. In addition, if the side wall 10Y is totally made of a conductive material, the degree of shield for the MEMS structure 3X by the conductive material is further enhanced, thus allowing the electromagnetic interaction between the MEMS structure 3X and the outside to be reduced. Especially, coupling of the side wall 10Y and the first cover layer 7Y further enhances the effect of the electromagnetic shield for the MEMS structure 3X.

Third Embodiment

Figure 11:
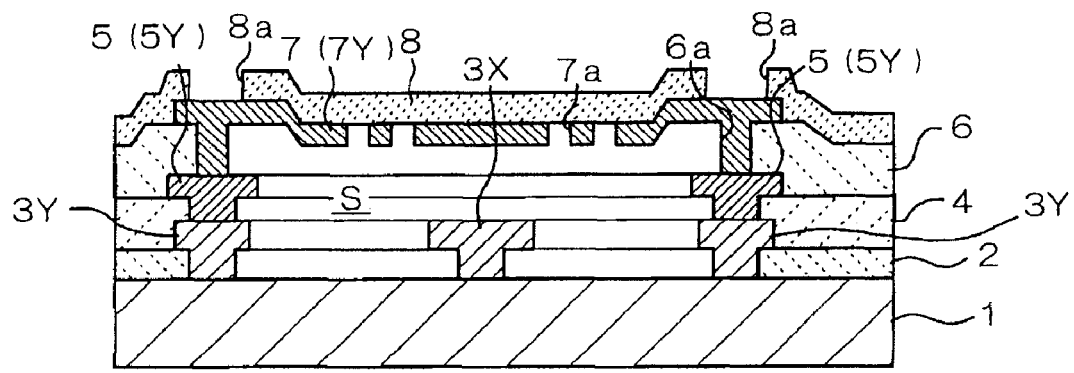
FIG. 11 is a longitudinal sectional view showing a structure of another electronic device.

FIG. 11 illustrates an example in which the above protection film 8 is used as a second cover layer. In this case, it is preferable that the second cover layer 8 is made of an insulating material. The protection film used also as the second cover layer reduces the number of processes (with the above-described deposition and patterning of the second cover layer 9 becoming unnecessary), thereby further lowering the cost of manufacture.

Fourth Embodiment

Figure 12:
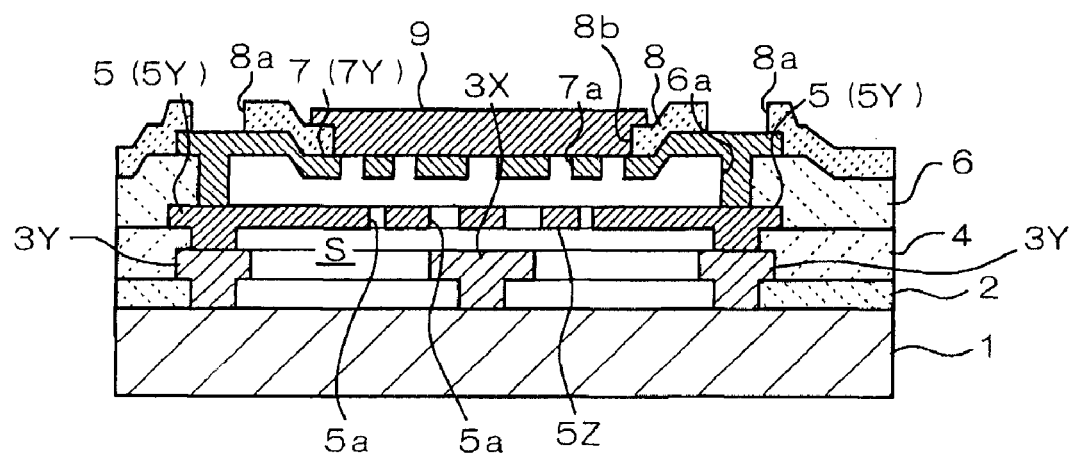
FIG. 12 is a longitudinal sectional view showing a structure of a different electronic device.

FIG. 12 shows an example in which part of the above wiring layer 5 covers the upside of the MEMS structure 3X while it also forms a third cover layer 5Z having through holes 5a. Here, the third cover layer 5Z is arranged in such a manner that it is horizontally overlapped by the through holes 7a of the first cover layer 7Y and that the through holes 5a are horizontally overlapped by the first cover layer 7Y. Namely, the planar areas exposed by the through holes 7a are covered by the third cover layer 5Z while the planar areas exposed by the through holes 5a are covered by the first cover layer 7Y. Thus, for example, if the second cover layer 9 is deposited by a vapor deposition method, adhesion of the material of the second cover layer 9 onto the MEMS structure 3X can be prevented. Therefore, as explained by FIG. 9, it becomes unnecessary to provide the planar area of the MEMS structure 3X and the aperture areas of the through holes 7a in such a manner that they are horizontally somewhat offset. In this case, the upside cover mentioned above is composed of the first cover layer 7Y, the second cover layer 9 and the third cover layer 5Z.

The electronic device and the method for manufacturing thereof according to embodiments are not limited to the illustrated examples described above. It goes without saying that they may be modified in a variety of ways insofar as the modifications do not deviate from the scope and spirit of the invention.

For example, in the embodiments described above, a semiconductor manufacturing process that is similar to a CMOS process is performed on a semiconductor substrate to form the MEMS structure 3X constituting a MEMS element as a functional element such as an actuator, a resonator, a high-frequency filter. However, embodiments may also include devices that include various functional elements other than MEMS elements, including quartz crystal resonators, SAW elements, acceleration sensors, gyro sensors, and the like.

Furthermore, in the embodiments described above, a semiconductor device formed by integration of a functional element and a semiconductor integrated circuit is made. However, a substrate other than a semiconductor substrate may be used, or an electronic circuit other than a semiconductor circuit may be coupled to a functional element.

What is claimed is:

1. An electronic device comprising:
a substrate;
a functional element formed above the substrate;
a guard ring surrounding the functional element, the guard ring being away from the functional element;
a first cover layer formed above the guard ring and the functional element, the first cover layer being away from the functional element, the first cover layer including at least one hole; and
a second cover layer formed above the first cover layer.

2. The electronic device according to claim 1, wherein the second cover layer includes a conductive material.

3. The electronic device according to claim 2, wherein the conductive material of the second cover layer includes Al, W or Ti.

4. The electronic device according to claim 1, wherein the second cover layer includes an insulating material.

5. The electronic device according to claim 4, wherein the insulating material of the second cover layer includes silicon oxide or silicon nitride.

6. The electronic device according to claim 1, wherein the guard ring includes a first guard ring and a second guard ring formed above the first guard ring.

7. The electronic device according to claim 6, wherein a material of the functional element is the same as a material of the first guard ring.

8. The electronic device according to claim 1, further comprising an insulating layer that surrounds the guard rings, the insulating layer includes a first insulating layer and a second insulating layer formed above the first insulating layer.

9. The electronic device according to claim 1 further comprises a passivation film formed above the first cover layer, the passivation film including an opening which exposes a part of the first cover layer, the part of the first cover layer being used as a pad.

10. An electronic device comprising:
a substrate;
a functional element formed above the substrate;
a guard ring surrounding the functional element, the guard ring being spaced at a distance away from the functional element;

a first cover layer formed above the guard ring and the functional element, the first cover layer being spaced away from the functional element, the first cover layer including at least one first hole;

a second cover layer formed above the first cover layer, the second cover layer including at least one second hole; and a third cover layer formed above the second cover layer.

11. The electronic device according to claim 10, wherein the at least one second hole overlaps the first cover layer in a plan view.

12. The electronic device according to claim 10, wherein a material of the functional element is the same as a material of the guard ring.

13. The electronic device according to claim 10, wherein the at least one first hole overlaps the second cover layer in the plan view.

14. The electronic device according to claim 10, further comprising a passivation film formed above the second cover layer, the film having an opening which exposes a part of the second cover layer, the part of the second cover layer being used as a pad.

15. The electronic device according to claim 1, wherein the functional element is a micro electromechanical system.

16. The electronic device according to claim 1, wherein the guard ring is an enclosure surrounding the functional element and planar shape of the guard ring is polygonal or circular.

17. The electronic device according to claim 1, wherein the guard ring being formed as a part of wiring layer, not conductively coupled to other wiring patterns.

* * * * *